United States Patent
Inoue et al.

(10) Patent No.: US 6,757,966 B2
(45) Date of Patent: Jul. 6, 2004

(54) COMPONENT MOUNTING SYSTEM AND MOUNTING METHOD

(75) Inventors: Masafumi Inoue, Saga (JP);
Mitsuhaya Tsukamoto, Fukuoka (JP);
Masat Fujioka, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 204 days.

(21) Appl. No.: 10/037,094

(22) Filed: Oct. 25, 2001

(65) Prior Publication Data

US 2002/0083570 A1 Jul. 4, 2002

(30) Foreign Application Priority Data

Oct. 25, 2000 (JP) .................................. 2000-325320
Oct. 25, 2000 (JP) .................................. 2000-325321

(51) Int. Cl.$^7$ ............................................. H05K 3/34
(52) U.S. Cl. ..................... 29/840; 29/712; 29/721; 29/740; 29/833; 228/9; 228/105; 700/117
(58) Field of Search ..................... 29/712, 720, 721, 29/739–741, 743, 832, 833, 840, 846, 854; 228/8, 9, 102, 104, 105; 700/9, 19, 28, 30–31, 44, 95, 117, 121

(56) References Cited

U.S. PATENT DOCUMENTS 5,003,692 A * 4/1991 Izumi et al. ................... 29/834
5,564,183 A * 10/1996 Satou et al. ................... 29/840
5,822,449 A * 10/1998 Kobayashi et al. ......... 382/141

* cited by examiner

Primary Examiner—Peter Vo
Assistant Examiner—Donghai D. Nguyen
(74) Attorney, Agent, or Firm—RatnerPrestia

(57) ABSTRACT

A component mounting system which includes a printer for printing solder on electrodes formed on a board; a first inspection unit for detecting positions of printed solder and outputting solder position detection results; a component mounting unit for picking up components from a component feeder carriage and placing the components on the board using mounting heads; a second inspection unit for inspecting positions of the components placed and outputting component position detection results; a soldering unit for soldering the components onto the board by heating and melting solder; and a main controller for updating at least a control parameter for controlling the printer operation or a control parameter for the component mounting unit operation based on at least the solder position detection results or component position detection results. The above configuration enables the accurate and efficient quality control throughout the mounting process.

9 Claims, 9 Drawing Sheets

COMPONENT MOUNTING SYSTEM AND MOUNTING METHOD

FIELD OF THE INVENTION

The present invention relates to a system and method for mounting components, such as electronic components, on a board.

BACKGROUND OF THE INVENTION

Increasingly accurate positioning for mounting components onto electrodes on a board is required as electronic components such as semiconductors become smaller and mounting density becomes higher. Numerous micro components measuring about 0.6 mm×0.3 mm are mounted at a narrow pitch of about 0.1 mm in small apparatuses such as mobile phones which are becoming increasingly popular consumer items. Mounting of such small components requires extremely high mounting position accuracy.

When mounting the above-mentioned micro components, it is necessary to pay particular attention to the mounting quality control. More specifically, the quality of mounted boards needs to be assured with respect to their use over a range of conditions without causing any defects. Accordingly, an inspection is carried out on boards after mounting for assuring functions, and if the board is judged defective, it is repaired. In most cases, defective mounted boards are repaired manually such as by removal of defective components and the mounting of new, non-defective components.

In case of boards on which the aforementioned micro components are mounted at high density, the above repair operation is extremely difficult if the defect is determined after all the components have been mounted. Most boards which are judged defective in the inspection after mounting are thus disposed of, resulting in wastage of expensive electronic components mounted at high density.

In order to prevent such wastefulness, the next operation is implemented in order to minimize the occurrence of defects in the conventional mounting operation. The operation of the mounting line is periodically stopped to allow the checking and adjustment of each device in a mounting line using a test board; and calibration is implemented to update control parameters, such as positioning correction values in accordance with the latest conditions of the machine. Since these operations require the machine to be halted, the operation rate drops. Operators also need to spend considerable time and effort carrying out complicated adjustments. Accordingly, more accurate and efficient quality control during the mounting process is required to eliminate wasted time and materials.

These defects also occur due to secular changes in the fine-tuning of individual mechanical part of the component mounting devices. Defects may also occur when individual components in each mechanical part suffer wear and cause faulty operation. In general, by updating control parameters set in each device in accordance with machine conditions, it is possible to offset secular changes in the fine-tuning and maintain the mounting accuracy. However, defects caused by the wearing out of mechanical parts often require that components be replaced, and thus maintenance time is needed for replacing components.

Conventionally, there are no clear indexes for identifying the degree of wear of mechanical parts, and thus skilled operators are needed to identify and pinpoint abnormalities based on the operating conditions of each device, forecast the type and degree of degradation of mechanical parts, and announce the need for maintenance. Accordingly, if abnormal operation occurs suddenly, without being predicted, numerous defectives may be produced before the abnormality is noticed, causing large-scale losses and requiring immediate maintenance.

SUMMARY OF THE INVENTION

The present invention solves the above disadvantages, and aims to offer a component mounting system and mounting method which enables the more accurate and efficient control of quality during the mounting process; makes it possible constantly to monitor the conditions prevailing in each device constituting the component mounting system, and eliminates wastage due to defects by predicting faulty operation.

The component mounting system of the present invention is configured by connecting two or more devices, and manufactures mounted boards by placing and soldering components on the board. This system comprises the following devices:

(a) a printer for printing solder onto electrodes formed on a board:

(b) a first inspection unit for detecting the positions of printed solder and outputting solder position detection results;

(c) a component mounting unit for picking up components from a component feeder carriage with a mounting head, and placing these components on the board;

(d) a second inspection unit for detecting the positions of mounted components, and outputting the component position detection results;

(e) a soldering unit for soldering components onto the board by heating and melting solder; and (f) a main controller for at least updating i) control parameters for controlling the operation of the printer; or ii) control parameters for controlling the operation of the component mounting unit based on at least solder position detection results or component position detection results.

The above configuration enables the component mounting system of the present invention to control quality more accurately and efficiently during the mounting process.

The method for mounting components of the present invention uses a component mounting system configured by connecting two or more devices, and manufactures mounted boards by placing and soldering components onto the board. This method includes the next steps:

(a) a printing step for printing solder on electrodes formed on the board using the printer;

(b) a solder position detection step for detecting the positions of printed solder and outputting solder position detection results using the first inspection unit;

(c) a placement step for picking up components from a component feeder carriage and placing them on the board using the mounting head of the component mounting unit;

(d) a component position detection step for detecting the positions of mounted components and outputting component position detection results using the second inspection unit; and (e) a soldering step for soldering components onto the board by heating and melting solder using the soldering unit.

While executing each of the above steps, at least the control parameters for controlling the operation of the printer or control parameters for controlling the operation of the component mounting unit are updated based on at least solder position detection results or component position detection results.

This method makes it possible to update control parameters for controlling the printer and/or component mounting unit inline based on solder position detection results and/or component position detection results when executing each step in the component mounting process: printing, solder position detection, placement, component position detection, and soldering. Accordingly, the quality is more accurately and efficiently controlled during the mounting process.

DESCRIPTION OF PREFERRED EMBODIMENTS

A preferred embodiment of the present invention is described next with reference to drawings.

Figure 1:
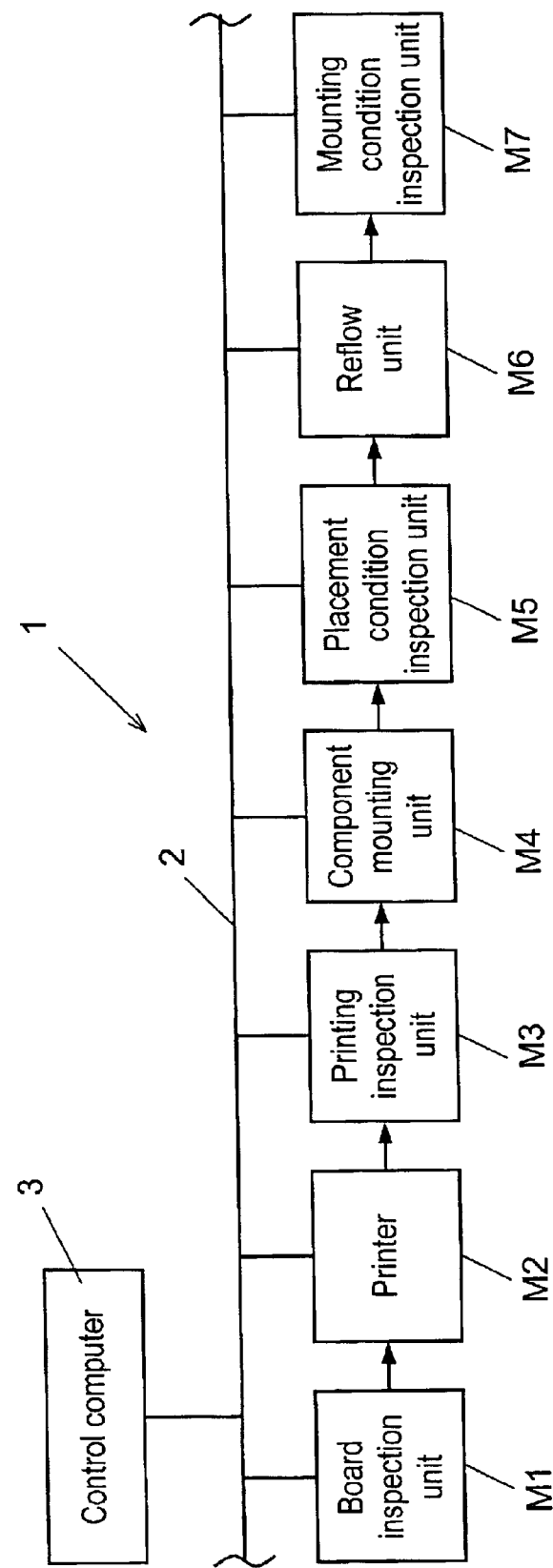
FIG. 1 is a block diagram illustrating the configuration of a component mounting system in accordance with a preferred embodiment of the present invention.

FIG. 1 is a block diagram illustrating the configuration of a component mounting system in the preferred embodiment of the present invention. First, the configuration of the component mounting system in the preferred embodiment is described with reference to FIG. 1. In FIG. 1, the mounting system is configured by connecting component mounting line 1 with communications network 2, and controlling the entire line by means of control computer 3. Component mounting line 1 is made by connecting devices, i.e., board inspection unit M1, printer M2, printing inspection unit (first inspection unit) M3, component mounting unit M4, placement inspection unit (second inspection unit) M5, reflow unit (soldering unit) M6, and mounting condition inspection unit (third inspection unit) M7.

Board inspection unit M1 inspects electrodes formed on the board. Printer M2 screen-prints solder paste on these electrodes for bonding components. Printing inspection unit M3 inspects the printed condition of the board after printing. Component mounting unit M4 places components on the board after solder paste is printed. Placement condition inspection unit M5 inspects the presence and positional deviation of components on the board after components are placed. Reflow unit M6 solders components onto the board by heating the board after components are placed. Mounting condition inspection unit M7 inspects mounting conditions of components on the board after soldering.

Next, the configuration of each device is described.

Figure 2:
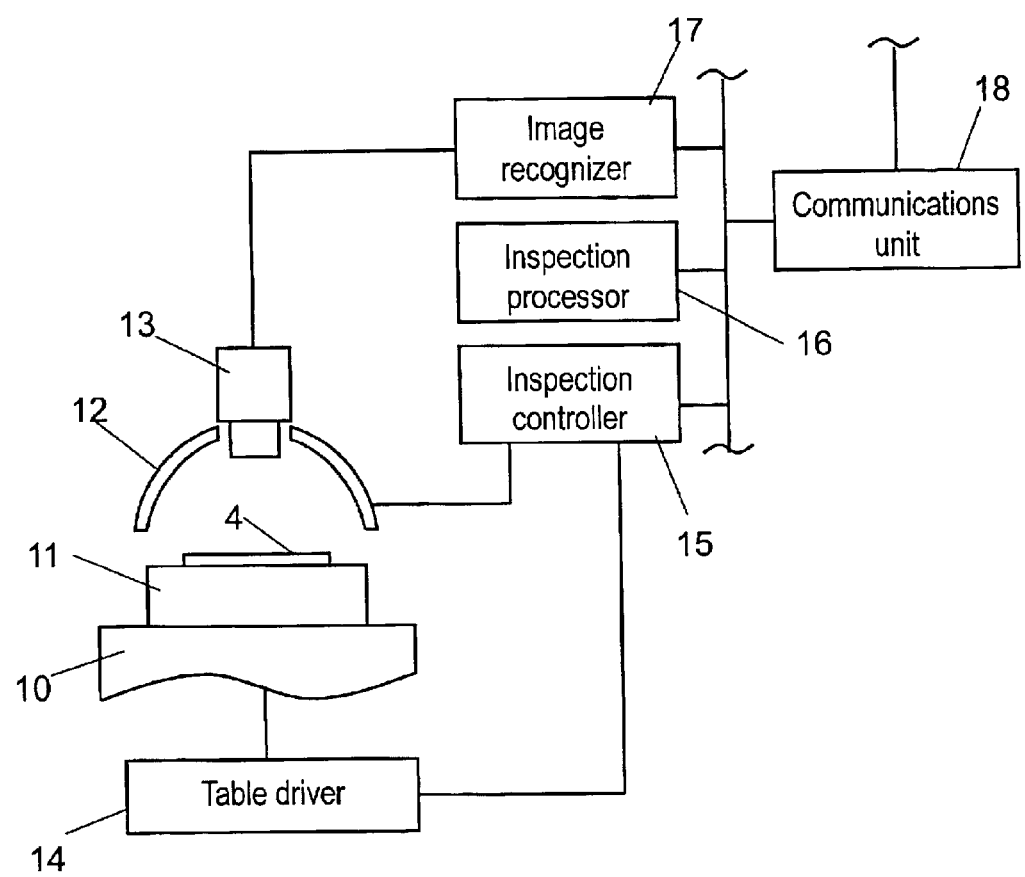
FIG. 2 is a block diagram illustrating the configuration of an appearance inspection unit in the component mounting system in accordance with the preferred embodiment of the present invention.

An appearance inspection unit which is used as board inspection unit M1, printing inspection unit M3, placement condition inspection unit M5, and mounting condition inspection unit M7 is described with reference to FIG. 2. In FIG. 2, board holder 11 is disposed on positioning table 10, and holds board 4. Camera 13 is disposed over board holder 11 with its image capturing side facing down. This camera 13 captures the image of board 4 while surrounding lighting unit 12 is turned on. A predetermined position on board 4 is set to right under camera 13 for capturing the image by controlling table driver 14 to drive positioning table 10.

Image data obtained by capturing images is processed by image recognizer 17, and recognition results are output. Inspection processor 16 judges the acceptability according to each inspection item based on the recognition results, and detected values for each predetermined item are output as feedback data and feed forward data. Output data is transmitted to control computer 3 and other devices through communications unit 18 and communications network 2 shown in FIG. 1. Inspection controller 15 controls table driver 14, camera 13, and lighting unit 12 for controlling the inspection.

Figure 3:
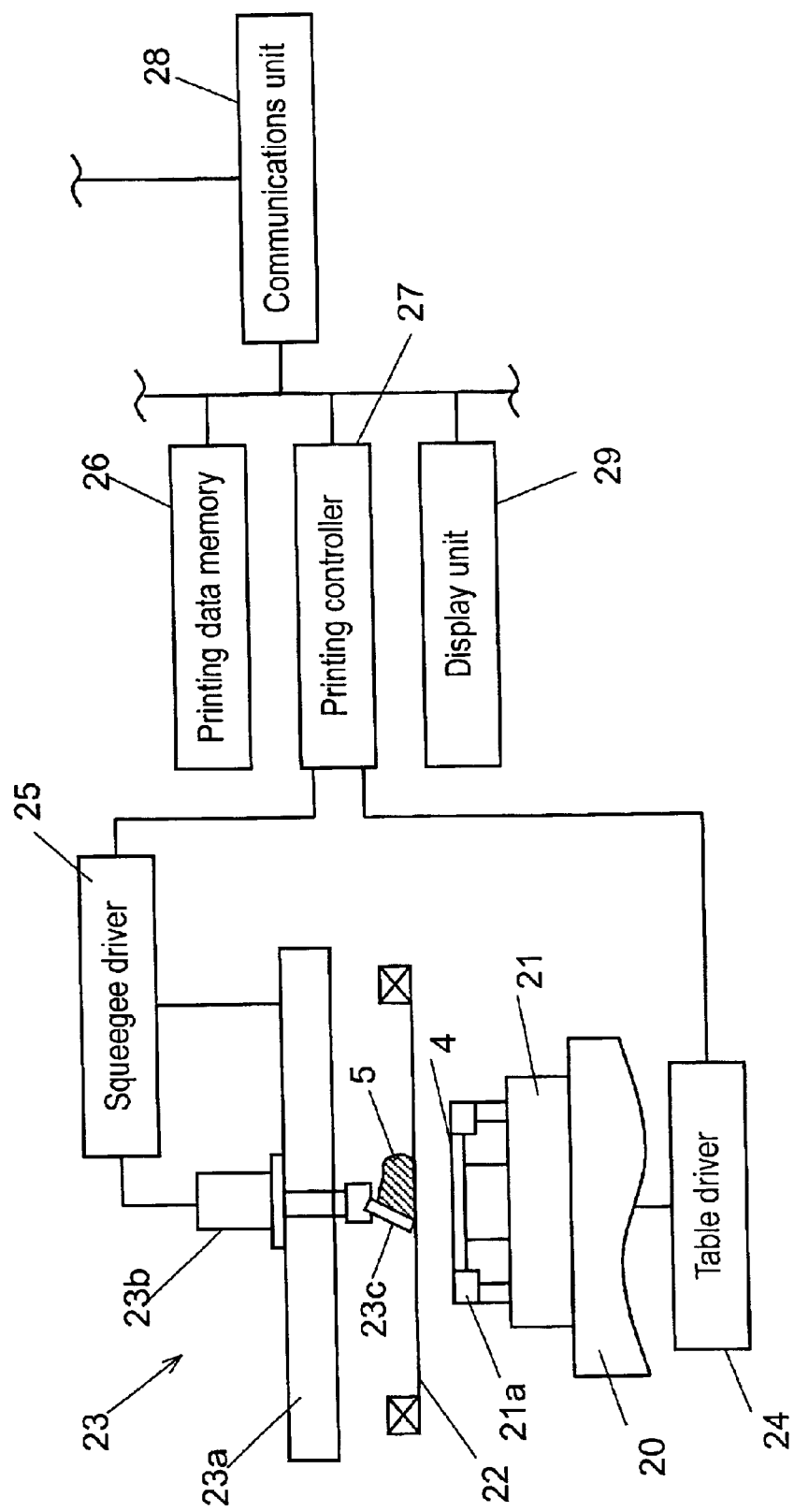
FIG. 3 is a block diagram illustrating the configuration of a screen printer in the component mounting system in accordance with the preferred embodiment of the present invention.

Next, the configuration of printer M2 is described with reference to FIG. 3. In FIG. 3, board holder 21 is disposed on positioning table 20. Board holder 21 holds board 4 by clamping board 4 from both sides with clamper 21a. Mask plate 22 is disposed over board holder 21. Pattern holes (not illustrated) corresponding to printing positions on board 4 are provided on mask plate 22. Board 4 moves horizontally and vertically relative to mask plate 22 by driving positioning table 20 using table driver 24.

Squeegee device 23 is disposed over mask plate 22. Squeegee device 23 rises squeegee 23c against mask plate 22, and has elevating pressure mechanism 23b which applies a predetermined pressure (printing pressure) onto mask plate 22 and squeegee transfer mechanism 23a which horizontally moves squeegee 23c. Elevating pressure mechanism 23b and squeegee transfer mechanism 23a are driven by squeegee driver 25. Squeegee 23c horizontally moves at a predetermined speed along the surface of mask plate 22, on which solder paste 5 is supplied, while board 4 contacts the bottom face of mask plate 22. This enables to print solder paste 5 on the upper face of board 4 through pattern holes.

Printer controller 27 controls table driver 24 and squeegee driver 25 for executing the above operation. The operation of squeegee 23c and positioning of board 4 and mask plate 22 are controlled based on printing data stored in printing data memory 26. Display unit 29 displays a range of index data for informing the operation state of the printer and abnormality messages which announce any abnormal state of printing. Communications unit 28 interchanges data with control computer 3 and other devices constituting component mounting line 1 through communications network 2 shown in FIG. 1.

Figure 4:
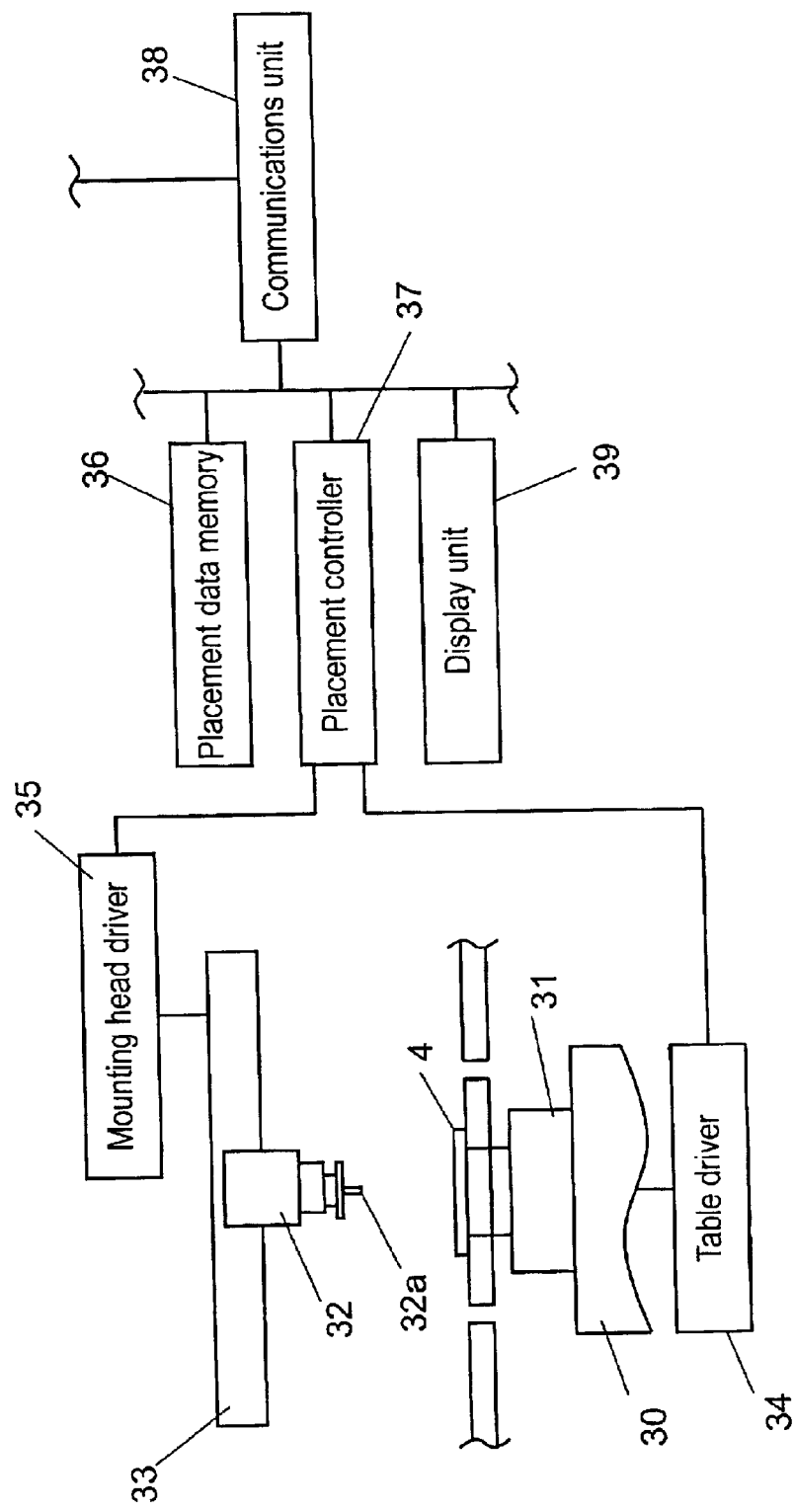
FIG. 4 is a block diagram illustrating the configuration of a component mounting unit in the component mounting system in accordance with the preferred embodiment of the present invention.

Next, the configuration of the component mounting unit is described with reference to FIG. 4. In FIG. 4, board holder 31 is disposed on positioning table 30. Board holder 31 holds board 4 transferred from printing inspection unit M3. Mounting head 32 which is moved by head driving mechanism 33 is disposed over board holder 31. Mounting head 32 is equipped with nozzle 32a for vacuum-holding components. Mounting head 32 takes out a component from a feeder carriage (not illustrated) with nozzle 32a by vacuum suction, then, moves over board 4, and lowers toward board 4 to place components held with nozzle 32a onto board 4.

Head driving mechanism 33 and positioning table 30 are respectively driven by mounting head driver 35 and table driver 34. A component placement position on board 4 by mounting head 32 may be controlled by controlling table driver 34 and mounting head driver 35 with placement controller 37 based on placement data stored in placement data memory 36, namely, component mounting coordinates on board 4. In other words, control commands output from placement controller 37 are employed as control parameters for controlling placement positions.

Display unit 39 displays index data announcing a range of operation states of component mounting unit M4 and abnormality messages which announce any abnormal state of placement operation. Communications unit 38 interchanges data with control computer 3 and other devices constituting component mounting line 1 through communications network 2 shown in FIG. 1.

Figure 5:
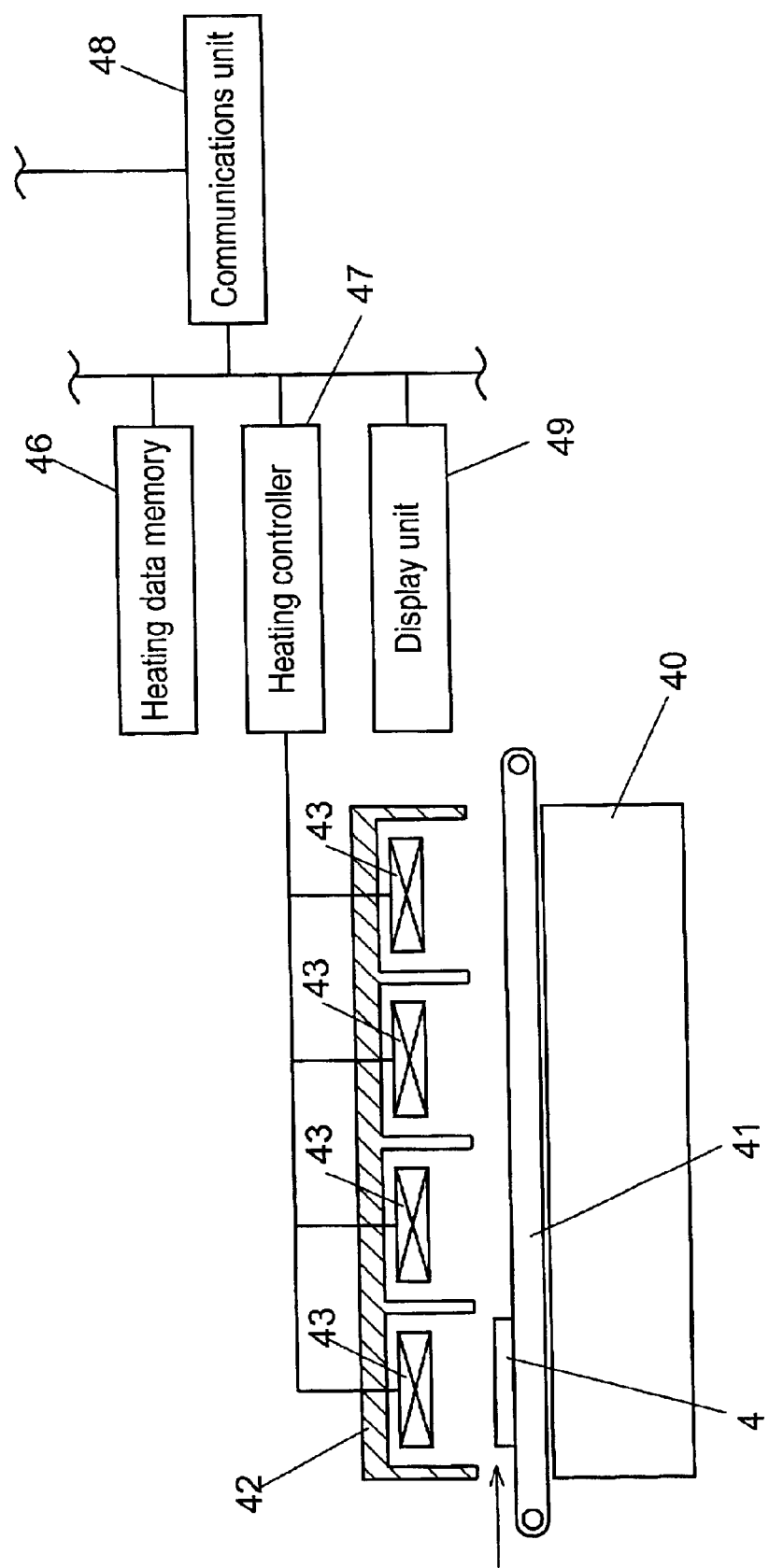
FIG. 5 is a block diagram illustrating the configuration of a reflow unit in the component mounting system in accordance with the preferred embodiment of the present invention.

Next, the configuration of a reflow unit is described with reference to FIG. 5. In FIG. 5, transport rail 41 is horizontally disposed in heating chamber 42 provided on base 40. Heating chamber 42 is partitioned into two or more heating zones. Each heating zone is equipped with heater 43 with a temperature-controlling function. Heater 43 is driven to heat up each heating zone according to predetermined temperature conditions, and then board 4 on which components are placed on solder paste passes through heating zones sequentially from the upstream. This heats up and melts the solder content in solder paste to solder components onto board 4.

In this reflow process, a predetermined temperature profile is set by controlling each heater 43 using heating controller 47 based on heating data stored in heating data memory 46, namely temperature commands which are control parameters for achieving the predetermined temperature profile in the reflow process. Display unit 49 displays index data announcing a range of operation states of reflow unit M6 and abnormality messages which announce any abnormal state of heating which exceeds tolerance in predetermined temperature conditions. Communications unit 48 interchanges data with control computer 3 and other devices constituting component mounting line 1 through communications network 2 shown in FIG. 1.

Figure 6:
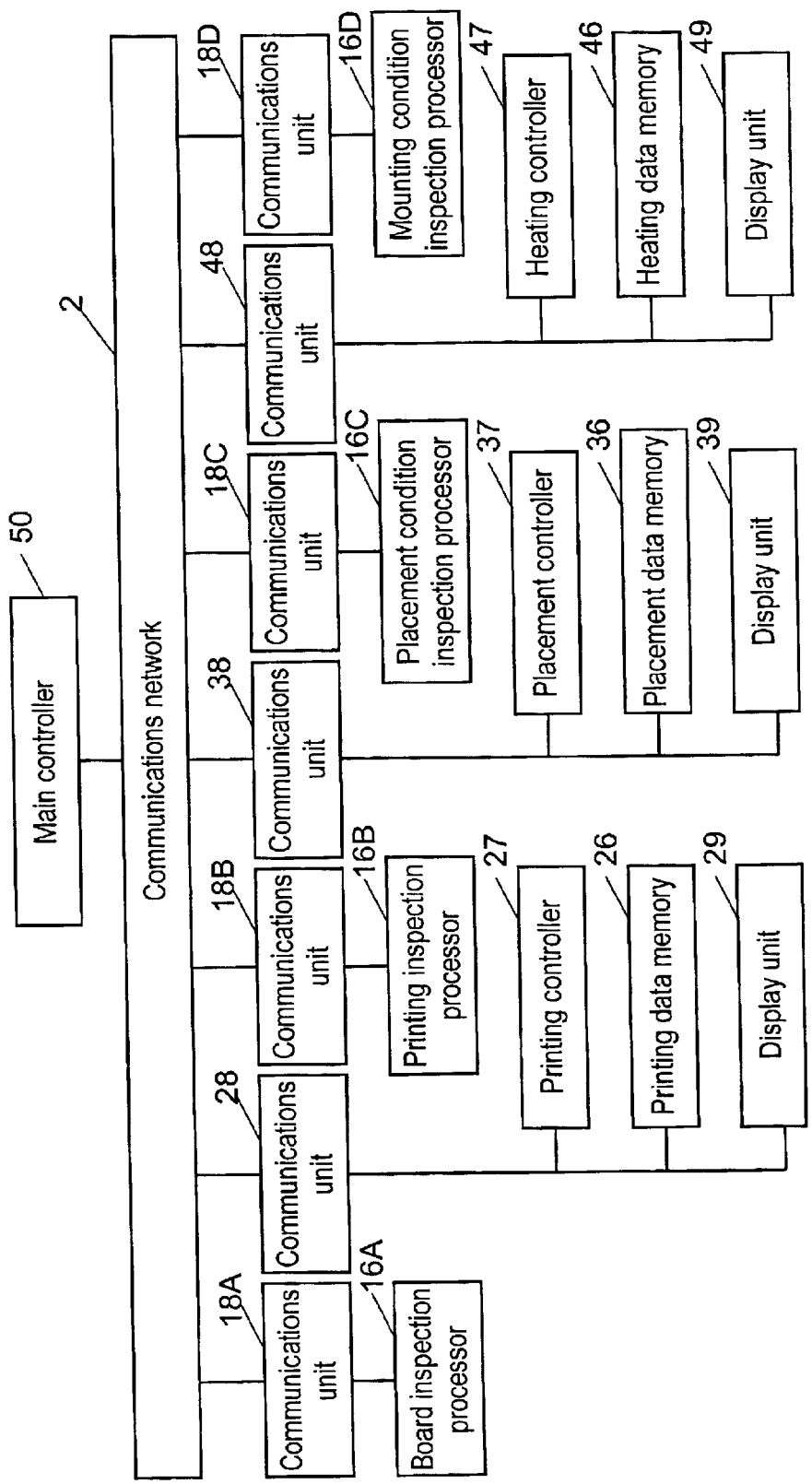
FIG. 6 is a block diagram of a control system in the component mounting system in accordance with the preferred embodiment of the present invention.

Next, the configuration of a control system of the component mounting system is described with reference to FIG. 6. Here, a data interchange function for controlling the quality in the component mounting process is described. In FIG. 6, main controller (overall control unit) 50 carries a quality control function in the control range of control computer 3. This main controller 50 receives data transferred from each device constituting the component mounting line through communications network 2, and necessary judgment is made based on a predetermined judgment algorithm. Processing results are then sent to each device as command data. In addition, main controller 50 identifies any abnormality in the operation in each device, and outputs abnormality message data to each device through communications network 2. In this case, main controller 50 thus functions as an abnormality evaluation means.

Board inspection processor 16A, printing inspection processor 16B, placement condition inspection processor 16C, and mounting condition inspection processor 16D installed, respectively, in board inspection unit M1, printing inspection unit M3, placement condition inspection unit M5, and mounting condition inspection unit M7 configured with the appearance inspection unit shown in FIG. 2 are connected to communications network 2 respectively through communications units 18A, 18B, 18C, and 18D. Each unit (see FIGS. 3, 4, and 5) installed in printer M2, component mounting unit M4, and reflow unit M6 is connected to communications network 2 respectively through communications units 28, 38, and 48.

These connections allow feedback processing for correcting and updating control parameters in upstream devices and feed forward processing for correcting and updating control parameters in downstream devices as required at any time during the operation of each device based on data processed in any of inspection steps. In addition, this configuration enables the detection of any abnormality in operation occurring in upstream devices inline, and notifies it inline to enable the necessary action to be taken immediately.

Next, the component mounting method and calibration implemented in the mounting process, namely the correction and update of control parameters, are described.

Figure 7A:
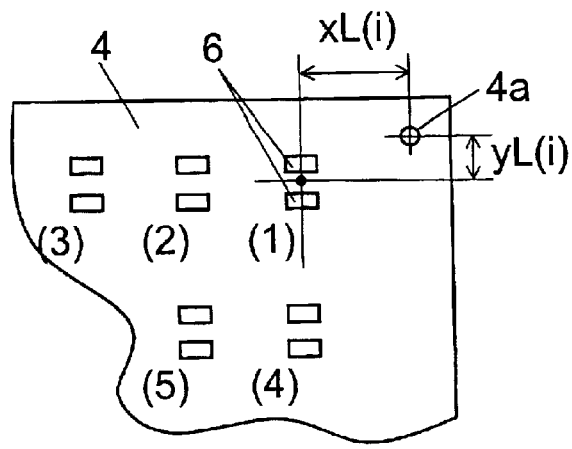
FIGS. 7A to 7C are explanatory views of appearance inspection of the board in accordance with a component mounting method in the preferred embodiment of the present invention.

First, board 4 supplied from a board feeder (not illustrated) is loaded into board inspection unit M1 (see FIG. 2). Here, camera 13 takes and recognizes the image of board 4 so that each electrode segment (1) to (n) of electrode 6 formed on board 4 is recognized as shown in FIG. 7A. This makes it possible to obtain positional data (electrode position data) indicating the barycenter of a pair of electrodes 6 in each electrode segment as coordinates xL (i), yL (i) relative to recognition mark 4a on board 4. These coordinates are sent to board inspection processor 16A shown in FIG. 6.

Figure 8A:
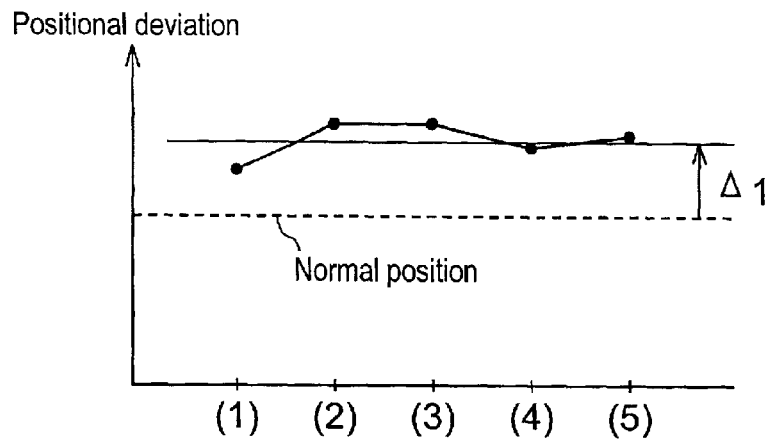
FIGS. 8A to 8C and FIGS. 9A to 9C are explanatory views for positional deviation detection results in the component mounting method in accordance with the preferred embodiment of the present invention.

Board inspection processor 16A inspects based on several coordinates calculated for each electrode segment. In other words, coordinates are statistically processed to evaluate the acceptability of board being inspected. At the same time, the trend of electrode positional deviation is evaluated for each board. Then, as shown in FIG. 8A, deviation Δ1 is calculated as numeric data if a positional deviation of an actual electrode position from the normal position in design data is concentrated in a particular direction within the allowable deviation range.

Feedforward operation is executed to correct the control parameters in downstream units to counteract this deviation. Deviation data for feedforward processing is transferred to communications network 2 through communications unit 18A shown in FIG. 6, and main controller 50 outputs deviation data as compensatory commands to downstream printer M2 and component mounting unit M4.

Next, board 4 is loaded into printer M2 and held with board holder 21, as shown in FIG. 3. Solder paste 5 is then printed on this board 4. Here, printing data memory 26 stores the compensation commands made based on electrode position deviation data via the above-mentioned feedforward processing. Transfer of positioning table 20 is compensated based on this compensation command when positioning table 20 is driven to position board 4 relative to mask plate 22. This allows printer M2 to print solder paste in an appropriate position on electrode 6 even though the position of the electrode has deviated from the normal position relative to recognition mark 4a on board 4.

Figure 7B:
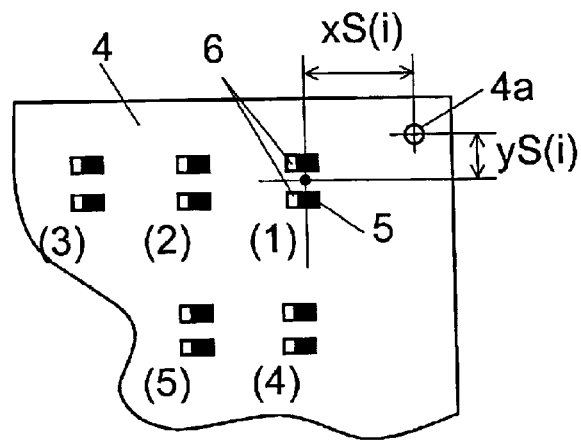
Figure 8B:
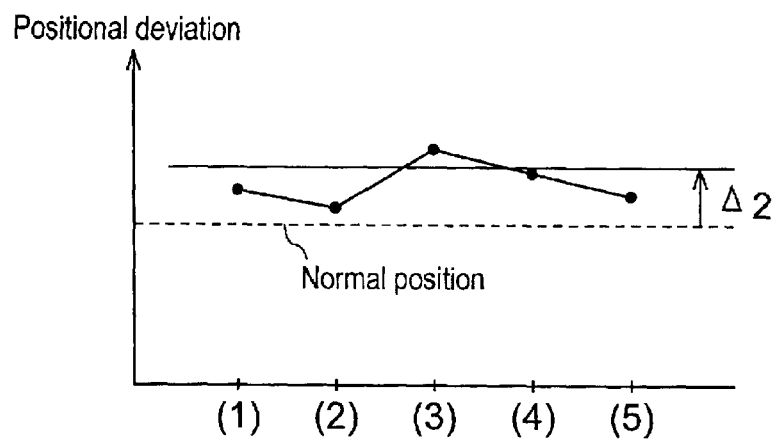

Next, board 4 is loaded into printing inspection unit M3 after printing solder paste. Here, positional data indicating the barycenter of solder paste 5 printed on a pair of electrodes 6 is calculated for all electrode segments (l) to (n), as shown in FIG. 7B, as coordinates xS (i), yS (i) relative to recognition mark 4a by image recognition. Recognition results are similarly examined at printing inspection processor 16B to judge the acceptability of printing and determine the trend of deviation in printing position. The printing inspection processor calculates the positional deviation relative to the normal position, as shown in FIG. 8B, as deviation Δ2, and this result is transferred to communications network 2 through communications unit 18B.

Deviation data obtained through printing inspection is used both for feedback and feedforward processing. More specifically, control parameters in printer M2 used for printing onto inspected board 4 and printing positions detected through inspection are compared to identify positional deviation caused by printer M2. Positional deviation in printing may be reduced by implementing calibration to correct control parameters in printer M2 for this positional deviation. In addition, printing position deviation data is fed forward to downstream component mounting unit M4.

Furthermore, a soldered area (shaded area on electrode 6 in FIG. 7B) in each electrode segment is calculated based on image data on solder paste printed on each electrode 6 for detecting solder printing volume for each electrode segment. If the detected solder printing volume exceeds the allowable range, printing conditions are judged to be defective, and this is displayed.

Printing conditions include squeegee speed for moving squeegee 23C on mask plate 22, pressure applied by squeegee 23c onto mask plate 22, and mask releasing speed for separating board 4 from the bottom face of mask plate 22 after squeegeeing. These types of numeric data for controlling printing operation are set as control parameters.

Next, board 4 after solder printing is loaded into component mounting unit M4. Here, component 7 is placed on electrode 6 on which solder paste 5 has been printed. When components are placed on board 4 using mounting head 32, components are placed after correcting control parameters given to table driver 34 and mounting head driver 35 for deviation Δ2 informed through feedforward processing. This makes it possible to place component 7 accurately without causing deviation with respect to solder paste 5 printed on board 4, even if the printing position of solder paste 5 is generally deviated.

Figure 7C:
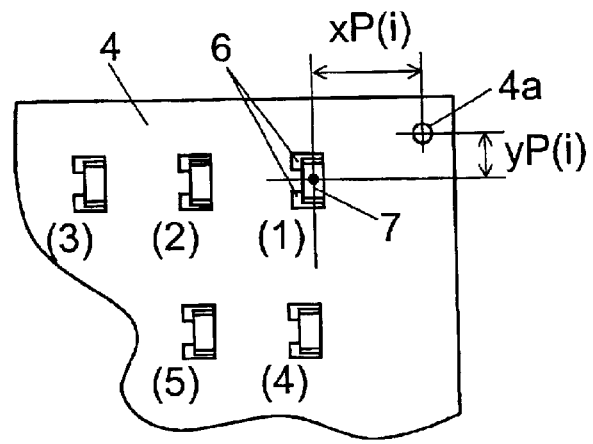

Next, board 4 after components are placed is loaded into placement condition inspection unit M5. Here, an appearance inspection is carried out to check component placement conditions. In other words, as shown in FIG. 7C, position data (component position data) indicating the barycenter of component 7 placed is identified for each electrode segment (l) to (n) as coordinates xP (i), yP (i) relative to recognition mark 4a.

Figure 8C:
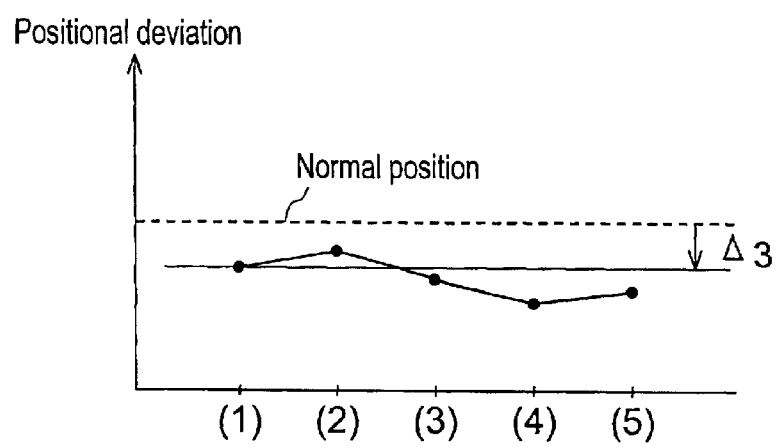

Recognition results are examined by the placement inspection processor 16c, and the acceptability of placement condition and any trend in deviation of placement position are determined to calculate deviation Δ3 as positional deviation with respect to normal position as shown in FIG. 8C. This deviation data is similarly transferred to communications network 2. Deviation data for placement position is fed back to component mounting unit M4 to implement calibration for correcting control parameters for deviation Δ3.

When component 7 is missing on electrode 6, component 7 is not placed in the correct direction and standing up, or component 7 is significantly rotated, these conditions are detected when recognizing the image, and placement operation is judged to be abnormal. This information is then displayed.

The above position data and placement operation abnormal data are statistically processed for each parts feeder in the component feeder carriage where components are stored and for each nozzle that holds components. Furthermore, statistical processing is implemented for each mounting angle of each nozzle if component mounting unit M4 has several transfer heads such as a rotary mounting unit, and several nozzles installed in each transfer head are rotatable for mounting different component at varying mounting angles. Accordingly, fine calibration for each target may be implemented based on reliable correction value calculated through statistical processing when correcting control parameters.

Board 4 on which components are placed is then loaded into reflow unit M6. Here, board 4 is heated in accordance with a predetermined temperature profile so that the solder content in solder paste 5 melts and solders component 7 onto electrode 6. Board 4 after reflow is loaded into mounting condition inspection unit M7, and final component mounting conditions are inspected. More specifically, appearance inspection is implemented to check missing component 7, direction and position of component 7, and any abnormality. In these inspection items, any abnormality caused by heating conditions during the reflow process is fed back to reflow unit M6, and the control parameters in heating data memory 46 are corrected.

As described above, the component mounting method in the preferred embodiment comprises a printing step for printing solder onto electrodes to bond the components; a solder position detection step for detecting the position of printed solder and outputting solder position detection results as solder position data; a placement step for placing components on electrodes on which solder is printed; a component position detection step for detecting the position of components placed and outputting component position detection results as component position data; and a soldering step for soldering components placed onto the board. Before executing each step, control parameters for controlling the printer and component mounting unit are updated based on solder position data and component position data, and printing and placement operations are calibrated as required.

This makes it possible, unlike with the conventional offline calibration system that uses a test board, to calibrate each unit inline during operation without halting the component mounting line. Accordingly, the present invention implements continuous calibration to prevent loss of printing position accuracy and placement position accuracy due to variable factors such as secular changes in mechanical parts or changes in ambient temperature.

Calibration implemented based on data detected inline significantly reduces the manufacture of defective boards: this was not possible in the prior art. In addition, the elimination of offline calibration allows improvement in the operation rate of the mounting devices.

Next, how abnormal operation is detected in the component mounting method and mounting process is described.

First, board 4 supplied from a board feeder (not illustrated) is loaded into board inspection unit M1 (see FIG. 2). Here, camera 13 takes and recognizes the image of board 4 so that each electrode segment (l) to (n) of electrode 6 formed on board 4 is recognized as shown in FIG. 7A. This makes it possible to obtain position data (electrode position data) indicating the barycenter of a pair of electrodes 6 in each electrode segment as coordinates xL (i), yL (i) relative to recognition mark 4a on board 4. These coordinates are sent to board inspection processor 16A.

Figure 9A:
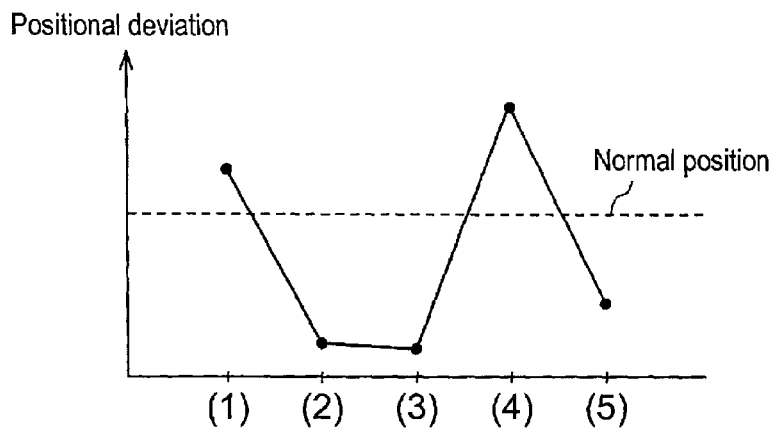

Board inspection processor 16A inspects based on several coordinates calculated for each electrode segment. In other words, coordinates are statistically processed to evaluated the acceptability of the board being inspected. At the same time, the trend of electrode positional deviation is judged for each board. Then, as shown in FIG. 9A, the board supplied is examined to be defective, and this information is output if positional deviation of actual electrode position against normal position in design data exceeds an allowable deviation range.

Figure 9B:
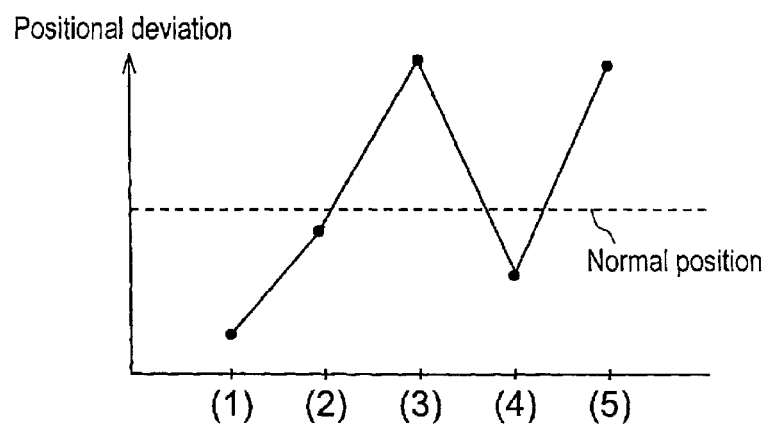

Next, board 4 is loaded into printer M2 and held with board holder 21. Solder paste 5 is then printed on this board 4. Board 4 is then loaded into printing inspection unit M3 after printing solder paste. Here, positional data indicating the barycenter of solder paste 5 printed on a pair of electrodes 6 is calculated for each electrode segments (l) to (n), as shown in FIG. 7B, as coordinates xS (i), yS (i) relative to recognition mark 4a by image recognition. Recognition results are similarly examined at printing inspection processor 16B to judge the acceptability of printing and determine a trend of deviation in printing position. The operation of the printer is judged abnormal and this information is output if positional deviation varies exceeding the allowable range as shown in FIG. 9B.

Furthermore, a soldered area (shaded area on electrode 6 in FIG. 7B) in each electrode segment is calculated based on image data on solder paste printed on each electrode 6 for detecting solder printing volume for each electrode segment. If the detected solder printing volume varies exceeding the allowable range, printing conditions are judged to be defective, and this is displayed.

Printing conditions include squeegee speed for moving squeegee 23C on mask plate 22, pressure applied by squeegee 23c onto mask plate 22, and mask releasing speed for separating board 4 from the bottom face of mask plate 22 after squeegeeing. These types of numeric data for controlling printing operation are set as control parameters.

Next, board 4 after solder printing is loaded into component mounting unit M4. Here, component 7 is placed on electrode 6 on which solder paste 5 has been printed. Board 4 after components are placed is then loaded into placement condition inspection unit M5. Here, an appearance inspection is carried out to check component placement conditions. In other words, as shown in FIG. 7C, position data (component position data) indicating the barycenter of component 7 placed is identified for each electrode segment (l) to (n) as coordinates xP (i), yP (i) relative to recognition mark 4a.

Figure 9C:
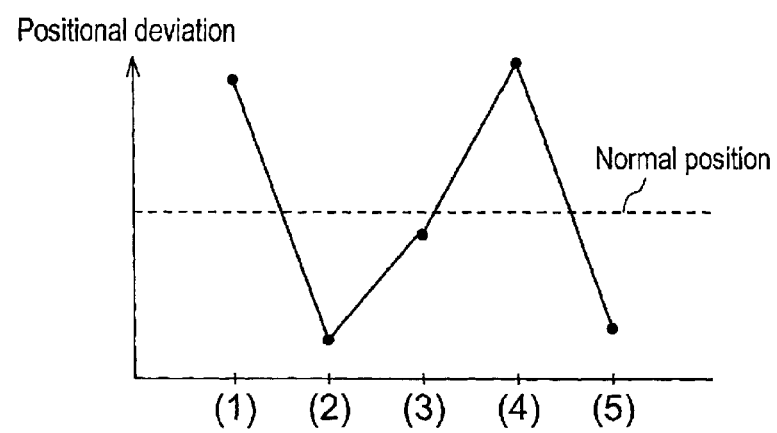

Recognition results are examined by placement inspection processor 16c, and the acceptability of placement condition and any trend in deviation of placement position are determined. When component 7 is missing on electrode 6, component 7 is not placed in the correct direction and standing up, component 7 is deviated exceeding the allowable range, or variation in positional deviations is exceeding the allowable range, as shown in FIG. 9C, these conditions are judged to be abnormal, and this information is displayed.

The above position data and placement operation abnormal data are statistically processed for each parts feeder in the component feeder carriage where components are stored and for each nozzle holding components. Furthermore, statistical processing is implemented for each mounting angle of each nozzle if component mounting unit M4 has several transfer heads such as a rotary mounting unit, several nozzles installed in each transfer head are rotatable for mounting different component at varying mounting angles.

This enables to easily identify the target for correcting control parameters or replacing components. More specifically, if positional deviation or abnormal placement operation exceeding the allowable range frequently occurs on components taken out from particular parts feeder, some kind of problem is judged to be occurring in this particular parts feeder. If positional deviation to a particular direction or abnormal operation is detected on only a particular nozzle, wear of this nozzle or driving mechanism parts may be predicted.

Board 4 on which components are placed is then loaded into reflow unit M6. Here, board 4 is heated in accordance with a predetermined temperature profile so that solder content in solder paste 5 melts and solders component 7 onto electrode 6. Board 4 after reflow is loaded into mounting condition inspection unit M7, and final component mounting conditions are inspected. More specifically, appearance inspection is implemented to check missing component 7, direction and position of component 7, and any abnormality. These inspection results allow to detect abnormal heating conditions in reflow unit M6.

As described above, the component mounting method in the preferred embodiment comprises the printing step for printing solder onto electrodes to bond the components; a solder position detection step for detecting the position of printed solder and outputting solder position detection results as solder position data; placement step for placing components on electrodes on which solder is printed; a component position detection step for detecting the position of components placed and outputting component position detection results as component position data; and soldering step for soldering components placed onto the board. Before executing each step, any abnormal operation in the printer, component mounting unit, and soldering unit is evaluated and informed based on solder position data, component position data, and mounting inspection results.

This makes it possible always to identify the conditions of each device constituting the component mounting system and allows the pre-emptive discovery of faults in the operation. Accordingly, maintenance such as replacement of components can be implemented immediately when a problem actually occurs. Mass generation of defectives by letting faulty devices continue to operate is preventable and wastefulness can thus be eliminated.

The present invention updates control parameters for controlling the printer and component mounting unit inline based on solder position data and component position data before executing each of printing step, solder position detection step, placement step, component position detection step, and soldering step that form the component mounting process. This enables to more accurately and efficiently control the quality in the mounting process.

The present invention also evaluates and provides information on the presence of abnormality in the operation of the printer, component mounting unit, and soldering unit based on solder position data, component position data, and mounting inspection results before executing the printing step, solder position detection step, placement step, component position detection step, soldering step, and mounting inspection step that form the component mounting process in the component mounting system. This enables the continuous monitoring of the conditions of each device consti-

What is claimed is:

1. A component mounting system, configured by connecting a plurality of devices, for manufacturing a mounted board by placing and soldering a component onto the board, said component mounting system comprising:
   (a) a printer for printing solder onto an electrode formed on said board;
   (b) a first inspection unit for detecting a position of said printed solder and outputting a solder position detection result;
   (c) a component mounting unit for picking up said component, and placing said component on said board;
   (d) a second inspection unit for detecting a position of said component placed and outputting a component position detection result;
   (e) a soldering unit for soldering said component onto said board by heating and melting said solder;
   (f) a main controller for updating at least one of a control parameter for controlling an operation of said printer and a control parameter for controlling an operation of said component mounting unit based on at least one of said solder position detection result and said component position detection result, said updating of said main controller based on feedback processing and feed forward processing or at least one of said solder position detection result and said component position detection result; and
   (g) a board inspection unit for inspecting said electrode and evaluating positional deviation of said electrode, said board inspection unit inspecting said electrode before printing of solder by said printer.

2. The component mounting system as defined in claim 1 further comprising a third inspection unit for inspecting a mounting condition by recognizing said component after said soldering, and outputting a mounting inspection result.

3. A component mounting system according to claim 1, wherein said updating of said main controller based on feedback and/or feedforward processing of said solder position detection result and said component position detection result.

4. The component mounting system or defined in claim 1, wherein said updating of said main controller is based on feedback processing and feed forward processing of both said solder position detection result and said component position detection result.

5. The component mounting system as defined in claim 1, wherein there is feed forward processing between said board inspection unit and said printer.

6. A component mounting method for manufacturing a mounted board by placing and soldering a component onto a board using a component mounting system configured by connecting a plurality of devices, said method comprising:
   (a) a printing step for printing solder on an electrode formed on said board using a printer;
   (b) a solder position detection step for detecting a position of said printed solder and outputting a solder position detection result using a first inspection unit;
   (c) a placement step for picking up said component from a component feeder carriage and placing said component onto said board using a mounting head in a component mounting unit;
   (d) a component position detection step for detecting a position of said component placed and outputting a component position detection result using a second inspection unit;
   (e) a soldering step for soldering said component onto said board by heating and melting solder using a soldering unit; and
   (f) an inspecting step before said printing step for inspecting said electrode and evaluating positional deviation of said electrode;
   wherein at least one of a control parameter for controlling an operation of said printer and a control parameter for controlling an operation of said component mounting unit is updated based on at least one of said solder position detection result and said component position detection result while executing said steps, and said updating is based on feedback processing and feed forward processing of at least one of said solder position detection result and said component position detection result.

7. The mounting method as defined in claim 6, said method further comprising a mounting inspection step for inspecting a mounting condition by recognizing said component after said soldering, and outputting a mounting inspection result using a third inspection unit;
   wherein a control parameter for controlling an operation of said soldering unit is updated based on said mounting inspection result.

8. The mounting method as defined in claim 6, wherein said updating is based on feedback processing and feed forward processing of both said solder position detection result and said component position detection result.

9. The mounting method as defined in claim 6, wherein there is feed forward processing between said inspecting step and said printing step.

* * * * *

UNITED STATES PATENT AND TRADEMARK OFFICE
CERTIFICATE OF CORRECTION

PATENT NO. : 6,757,966 B2
DATED : July 6, 2004
INVENTOR(S) : Inoue et al.

It is certified that error appears in the above-identified patent and that said Letters Patent is hereby corrected as shown below:

Title page,
Item [75], Inventors, "Masat Fujioka" should read -- Masato Fujioka --.

Column 11,
Line 28, delete "or" and insert -- of --.

Signed and Sealed this

Seventh Day of June, 2005

JON W. DUDAS
*Director of the United States Patent and Trademark Office*